United States Patent [19]

Shannon

[11] Patent Number: 5,754,040
[45] Date of Patent: May 19, 1998

[54] APPARATUS FOR TESTING MEDIUM VOLTAGE PRIMARY DISTRIBUTION CABLES

[76] Inventor: Kurt P. Shannon, 67 Revere St., Milton, Mass. 02186

[21] Appl. No.: 603,585

[22] Filed: Feb. 21, 1996

[51] Int. Cl.⁶ .................................................. G01R 25/00
[52] U.S. Cl. .................................................. 324/86; 324/66
[58] Field of Search ........................ 324/509, 539, 324/541, 555, 66, 76.77, 86, 107, 108

[56] References Cited

U.S. PATENT DOCUMENTS

| | | | |
|---|---|---|---|
| 1,551,294 | 8/1925 | Fechheimer | 324/108 |
| 2,225,346 | 12/1940 | Pierre | 324/86 |
| 2,566,726 | 9/1951 | Huse et al. | 324/86 |
| 2,581,178 | 1/1952 | Broff | 324/886 |
| 2,935,620 | 5/1960 | Gardeen | 307/57 |
| 3,555,417 | 1/1971 | Mitchell, Sr. | 324/86 |
| 3,584,299 | 6/1971 | Csete | 324/86 |
| 3,594,767 | 7/1971 | Link | 340/253 |
| 4,039,937 | 8/1977 | Laass | 324/555 |
| 4,852,174 | 7/1989 | Bouchard | 324/66 X |
| 5,510,700 | 4/1996 | Pomatto | 324/66 |

*Primary Examiner*—Glenn W. Brown
*Attorney, Agent, or Firm*—Cesari and McKenna, LLP

[57] ABSTRACT

Apparatus for performing a variety of tests, including phase matching, detection of open phases and energized/not energized verification, on primary distribution cables. The apparatus is operable from a location which is physically remote from the primary distribution cables under test and does not require an ohmic contact to such lines, thereby substantially enhancing the safety of such testing.

26 Claims, 4 Drawing Sheets

APPARATUS FOR TESTING MEDIUM VOLTAGE PRIMARY DISTRIBUTION CABLES

BACKGROUND OF THE INVENTION

1. Field of the Invention

The present invention relates generally to the field of test equipment for electrical power systems and, more specifically, to an apparatus for performing phase matching, open phase detection or energized/not energized testing of primary distribution cables.

2. Discussion of the Related Art

In multi-phase electrical power systems, it is often necessary to perform a variety of tests on primary distribution cables (e.g., cables rated at 2400V or higher). For example, where primary distribution cables must be spliced to expand existing service or to repair damage, a technician who is responsible for performing the splice usually does not have prior knowledge of the phase sequences of the lines. Thus, before a given pair of primary distribution cables are physically joined (which is often a time-consuming process that must be performed in adverse environmental conditions), it is mandatory to ensure that the phases of the cables are, in fact, matched to prevent an out-of-phase short circuit condition.

Another type of phase testing which is frequently needed in connection with maintenance and repair of power systems is detection of open phases (i.e., detection of primary distribution cable faults which result in open circuits). Such open phases may arise as a result of accidental damage during excavation, cable failure (fault), or equipment which acts to open a circuit when certain conditions occur. In order to effect repairs, the open phase must first be detected and located at a certain point or along a certain segment of the primary distribution cable.

A third, frequently-performed test is to determine whether a particular primary distribution cable is energized. This type of test is of critical importance in verifying, for example, that a particular line is deenergized and that it is therefore safe to make contact with that line in order to perform additional testing, make repairs, etc.

While there are many conventional devices for performing these types of tests, such devices generally suffer from several major disadvantages. First, many, if not most, conventional devices must be operated in close physical proximity to the primary distribution cable(s) being tested. This proximity requirement presents an inherently dangerous situation due to the high voltages which are present when the lines are energized. This problem is exacerbated in urban areas where primary distribution cables are usually placed underground and service personnel can only gain access to such lines by entering small, enclosed areas via manholes. In such a close environment, the risk of shock is increased and an accident resulting in explosion or fire is highly likely to cause serious injury or death.

Second, most conventional phase testing devices require a direct (ohmic) connection of a test lead to the primary distribution cable(s) to be tested or, alternatively, require that the primary distribution cable(s) be ohmically connected to the test device. The requirement of a direct physical connection represents an additional, significant safety hazard since, at least when the lines are energized, a technician must perform testing with high voltage present at the test device.

A third disadvantage of some conventional devices is that they are incapable of withstanding rough treatment in rugged environments or adverse weather, nor performing rapidly and reliably in such conditions. This is a serious disadvantage in situations where a storm or natural disaster has caused great damage and massive repairs must be rapidly made in order to restore basic electrical service to a large number of customers.

SUMMARY OF THE INVENTION

In brief summary, the present invention provides an apparatus for reliably and accurately performing a variety of tests, including phase matching, detection of open phases and energized/not energized verification, with respect to primary distribution cables. Because the apparatus is operable from a location which is physically remote from the primary distribution cables under test and does not require an ohmic contact to such lines, a technician performing tests with the apparatus is not exposed to high voltage while performing tests. Thus, in addition to providing multi-test capability within a single instrument, the present invention provides significant safety advantages to technicians or other personnel involved with performing desired testing.

The present invention may be used to perform desired testing with respect to either underground or above ground primary distribution cables by simply providing test leads of appropriate lengths. It is lightweight, portable and features simple, rugged construction for highly reliable, accurate test results in adverse environments and weather conditions.

In a preferred embodiment, the apparatus comprises a detector mounted in a housing, a pair of probes connected to the detector, two sets of test terminals, a plurality of test leads (conductors) and a plurality of identification tags or markers. A test lead is connected between a respective one of the terminals and one of the primary distribution cables to be tested. Preferably, the test leads are sufficiently long to allow the detector to be remotely located (e.g., on the order of several feet to tens of feet) from the primary distribution cables while tests are performed. In addition, the test leads are preferably connected to the fully insulated primary distribution cables by semi-conductive tape or semi-conductive clamps, creating a capacitive test area which couples signals from the distribution cables to the test terminals, but prevents the transmission of high voltage to such terminals. As a result, when a technician performs tests and is located in close proximity to the detector, he or she is safely isolated from high voltage.

BRIEF DESCRIPTION OF THE DRAWINGS

This invention is pointed out with particularity in the appended claims. The above and further advantages of this invention may be better understood by referring to the following description taken in conjunction with the accompanying drawings, in which:

DETAILED DESCRIPTION OF ILLUSTRATIVE EMBODIMENTS

Figure 1:
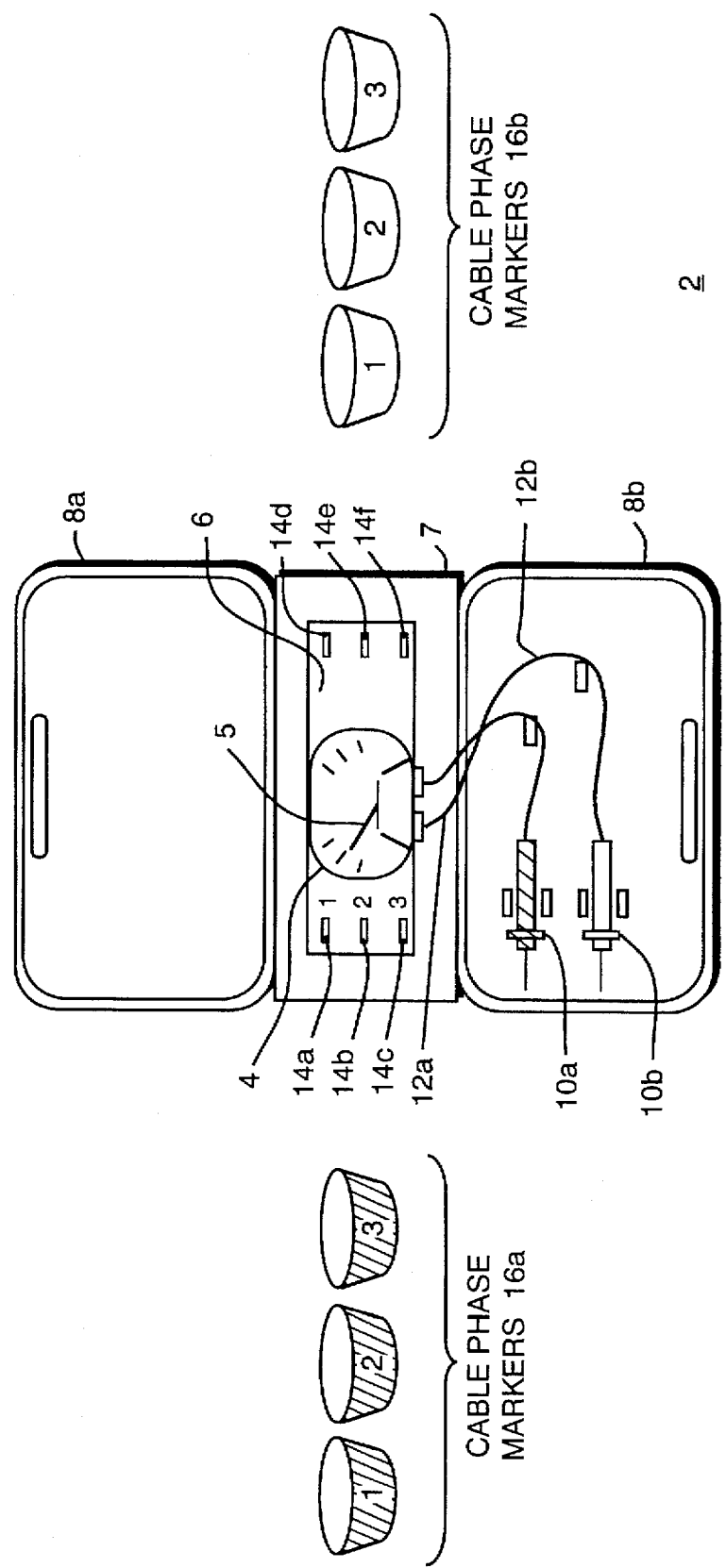
FIG. 1 is a top plan view of an apparatus for testing primary distribution cables which is constructed in accordance with a preferred embodiment of the present invention.

FIG. 1 shows a test set 2 having a detector 4 which produces visual test indications which may be observed by a technician (not shown). In a preferred embodiment, detector 4 may be implemented with a DC microammeter having a deflectable needle 5. Detector 4 is mounted in a housing 6, which is preferably constructed from plastic or other lightweight, non-conductive material. Housing 6 rests within a carry case 7, also preferably plastic, having hinged covers 8a and 8b, each of which includes a slot-type handle. Covers 8a and 8b may be opened (as shown) in order to operate test set 2 or closed for travel or storage.

Two test probes, 10a and 10b, are electrically connected to circuitry (not visible in FIG. 1), disposed within the interior of housing 6, by way of probe leads 12a and 12b, respectively. Test probes 10a and 10b are preferably of different colors, such as red and black, or otherwise marked such that they may be visually distinguished from each other.

To the left of detector 4, mounted on the top surface of housing 6, are three test terminals 14a, 14b and 14c. Located immediately adjacent to test terminals 14a, 14b and 14c, respectively, are terminal identification numerals 1, 2 and 3. To the right of detector 4 are three additional test terminals denoted by reference numbers 14d, 14e and 14f. Each of test terminals 14a–14f preferably comprises a combination of a threaded post, a nut and a wingnut for securing a test lead (not shown).

Shown in greatly enlarged form, for purposes of enhanced clarity, are two sets of cable phase markers 16a and 16b. Each set of markers preferably consists of three plastic rings or collars, each of which is labeled with an identification numeral 1, 2 or 3. When not in use, marker sets 16a and 16b may be stored in the vacant areas between housing 6 and carry case 7.

Figure 2:
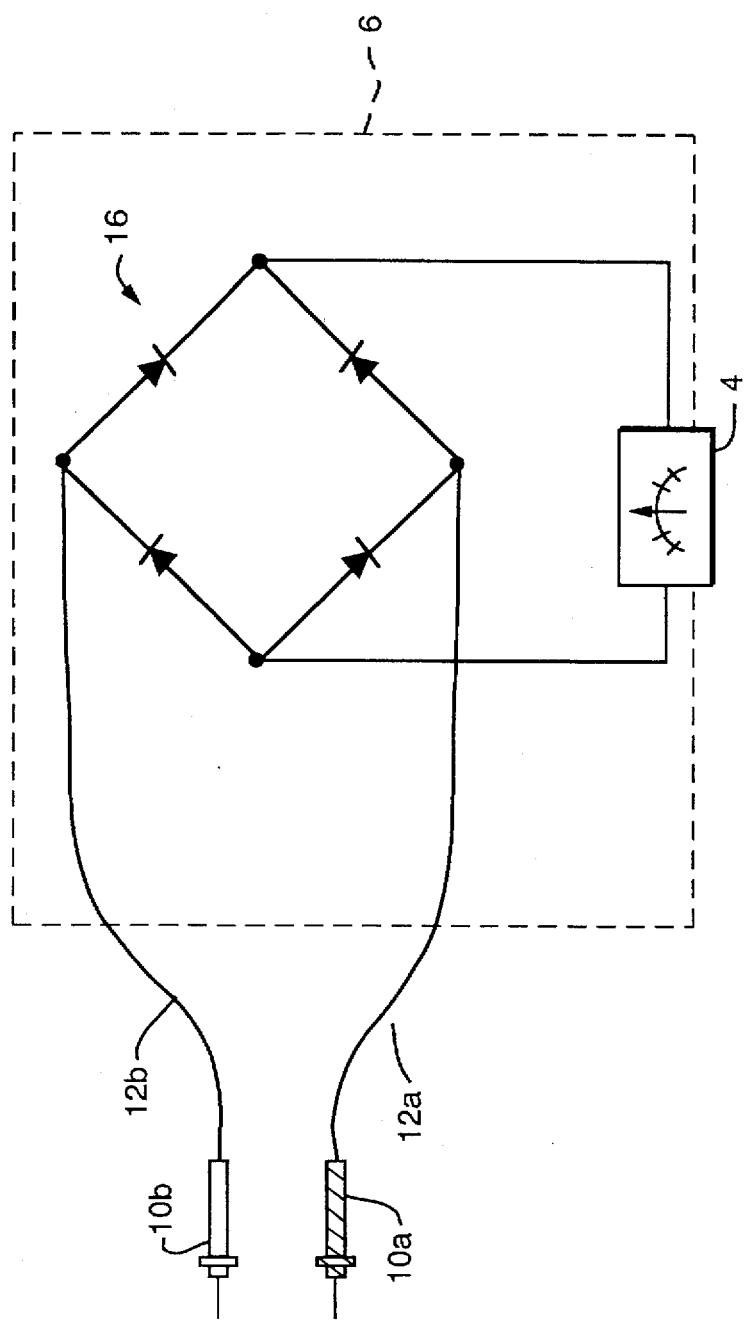
FIG. 2 is a circuit diagram of the detector shown in FIG. 1.

With reference now to FIG. 2, circuitry contained within the interior of housing 6 may be seen along with related electrical interconnections. Two opposite terminals of a bridge rectifier 16 are connected, respectively, to probe leads 12a and 12b. The remaining two terminals of rectifier 16 are connected to detector 4.

Figure 3:
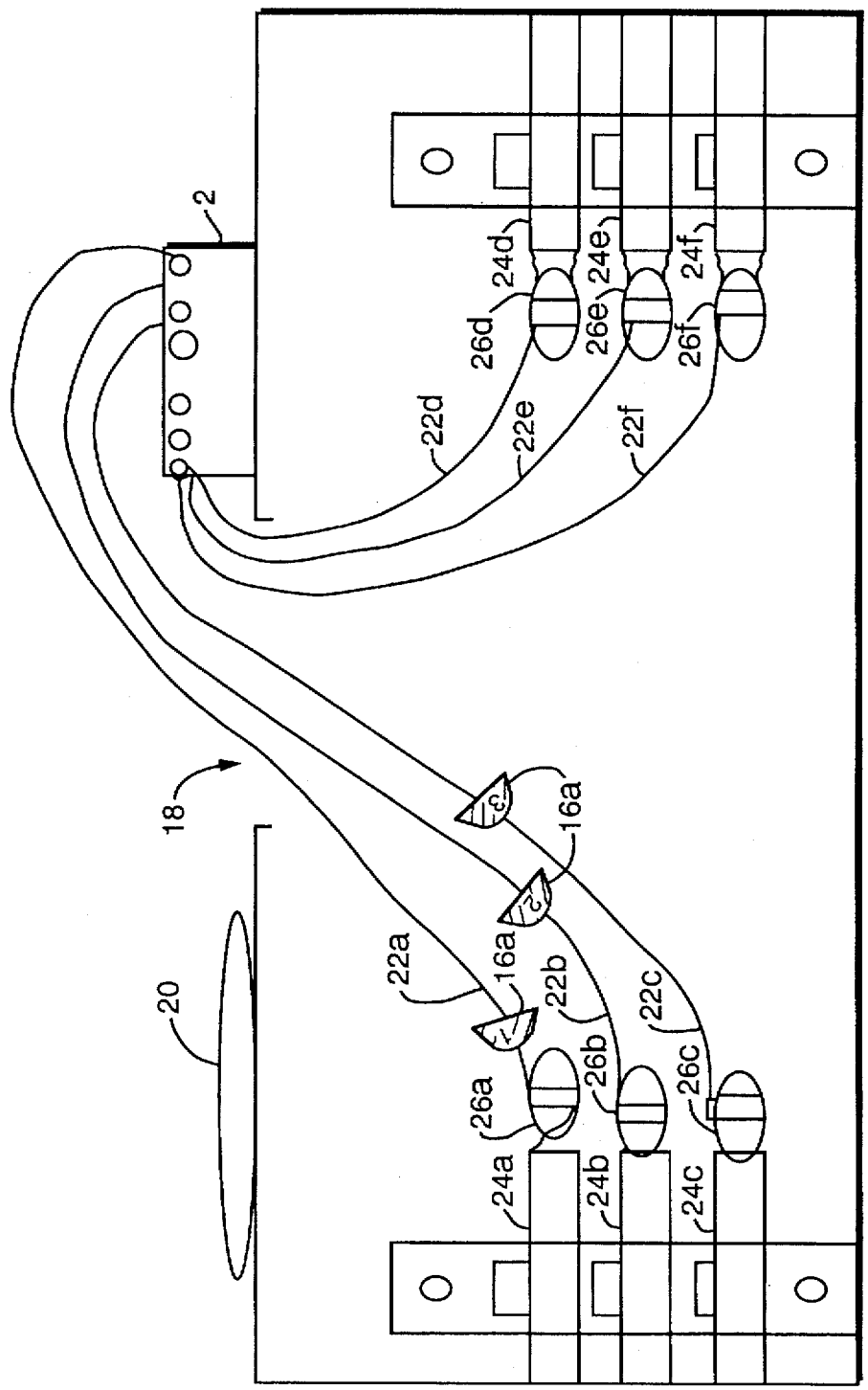
FIG. 3 is a block diagram showing the apparatus of FIG. 1 connected to perform phase match testing with respect to three-phase primary distribution cables.

Use of test set 2 to perform phase matching in connection with splicing of primary distribution cables may be best understood with reference to FIGS. 1 and 3. Test set 2 is placed in a convenient location at ground level adjacent to a manhole 18 which is normally closed by a cover 20. With the power turned off, a technician (not shown) enters manhole 18 and connects six test leads, denoted by reference numerals 22a–22f, respectively, between test set 2 and six primary distribution cables 24a–24f. Lines 24a, 24b and 24c may represent, for example, three-phase 5 kV distribution cables which are to be spliced to lines 24d, 24e and 24f. The technician secures one end of each test lead 22a–22f to a respective one of primary distribution cables 24a–24f by an associated one of semiconductive clamps 26a–26f. Alternatively, semiconductive tape or other fasteners may be used instead of clamps 26a–26f. It should be understood that various alternative devices may be substituted for test leads 22a–22f and clamps 26a–26f, provided that two objectives are preferably met: the device should operate to convey a signal of sufficient magnitude for detector 4 to sense, but the magnitude should also be sufficiently small that a technician performing a test will not be injured if accidental contact occurs.

The technician exits manhole 18 and secures the other end of each test lead 22a–22f to one of test terminals 14a–14f. More specifically, the ends of test leads 22a, 22b and 22c are connected to test terminals 14a, 14b and 14c, respectively, on test set 2. The ends of test leads 22d, 22e and 22f are similarly connected to test terminals 14d, 14e and 14f. It should be understood that it is permissible to connect different test leads to different test terminals so long as two conditions are met: there is only one lead connected to each test terminal, and the three leads attached to the primary distribution cables on one "side" of the intended splice are connected to test terminals on only one side of test set 2.

Next, the technician places three phase markers 16a, in any order, on the test leads (e.g., leads 22a, 22b and 22c) which are connected to test terminals 14a–14c, respectively. That is, the phase marker bearing the numeral "1" is placed on the test lead connected to test terminal 14a which is adjacent to identification numeral 1. The phase marker bearing the numeral "2" is placed on the test lead connected to test terminal 14b, and so on.

Phase markers 16a are preferably shaped and dimensioned such that gravity will cause them to slide down the test leads before coming to rest in proximity to primary distribution cables 24a–24c. At this point, with all connections established and no one present in manhole 18, power is turned on so that primary distribution cables 24a–24f are energized. As a result, energy from primary distribution cable 24a–24f is capacitively transferred across clamps 26a–26f and test leads 22a–22f connected thereto.

The technician now places one of test probes 10a and 10b on test terminal 14a while placing the other test probe, in succession, on each of test terminals 14d, 14e and 14f, and observing detector 4. Detector 4 provides a visual indication of whether the signals applied to test probes 10a and 10b are in phase or out of phase. For example, in a preferred embodiment in which a DC microammeter is used for detector 4, a large needle deflection is observed when signals applied to test probes 10a and 10b are out of phase. Conversely, when the applied signals are in phase, a very small or no needle deflection is observed.

Once the technician has determined which of the three primary distribution cables coupled to terminals 14d, 14e and 14f is in phase with the primary distribution cable coupled to terminal 14a, he or she will place the appropriate one of phase markers 16b (e.g., the marker bearing the numeral "1") on the appropriate test lead. The procedure is then repeated with respect to terminals 14b and 14c after which the power is again turned off, thus allowing the technician to safely reenter manhole 18 and mark the primary distribution cables with bands of tape or other suitable material to indicate the phases. At that point, the test leads may be removed in order to clear the way for the actual splicing of the cables; then at completion of splicing the technician exits manhole 18 before the power is again turned on.

Figure 4:
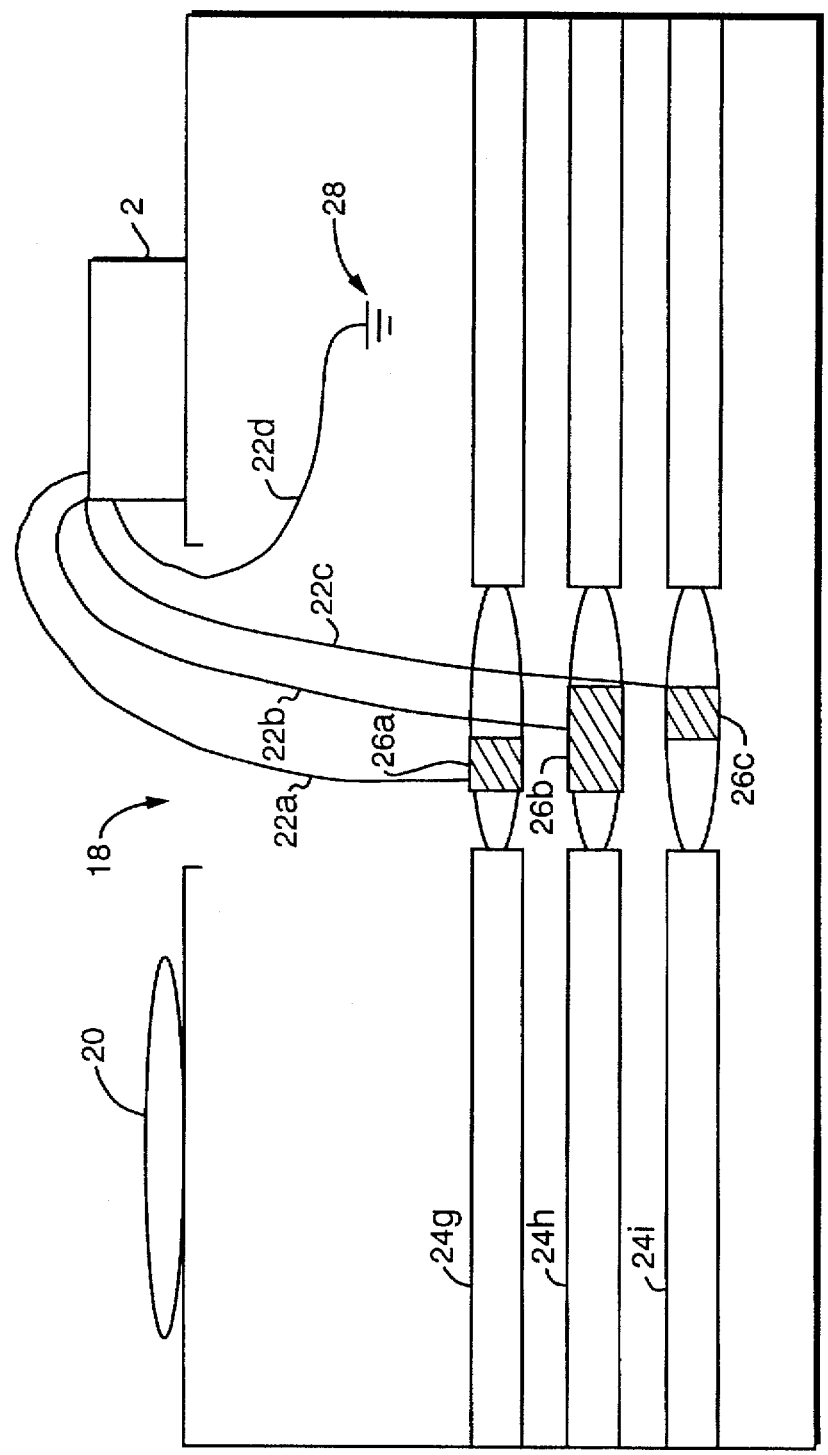
FIG. 4 is a block diagram of the apparatus of FIG. 1 connected to perform testing for open phases or verifying whether a particular primary distribution cable is energized.

Referring now to FIG. 4, a procedure for using test set 2 to perform open phase testing or verifying that a particular primary distribution cable is energized/not energized will now be described. With the power off, a technician enters manhole 18. The ends of test leads 22a–22c are coupled, respectively, by clamps 26a–26c to primary distribution cables 24g–24i. The opposite ends of test leads 22a–22c are connected, respectively, to test terminals 14a–14c. Test lead 22d, one end of which is connected to test terminal 14d, is connected to a ground point 28 within manhole 18. The technician now exits manhole 18 and the power is now turned on. The technician now contacts one of test probes 10a or 10b to one of test terminals 14a–14c and observe whether detector 4 registers a deflection, which serves as an indication that the primary distribution cable connected to the test terminal is energized. Next, the remaining test probe (either 10a or 10b) is placed in contact with test terminal 14d (ground) and detector 4 is again observed. If no deflection of detector 4 is observed in either of the preceding steps, the primary distribution cable which is coupled to the test terminal under test has an open phase.

The foregoing description has been limited to specific embodiments of this invention. It will be apparent, however, that variations and modifications may be made to the invention, with the attainment of some or all of the advantages of the invention. Therefore, it is the object of the appended claims to cover all such variations and modifications as come within the true spirit and scope of the invention.

What is claimed as new and desired to be secured by Letters Patent of the United States is:

1. Apparatus for remotely phase testing primary distribution cables, said apparatus comprising:
    means for coupling signals from a plurality of primary distribution cables to be tested with a test set such that during testing said test set is remote from high voltage carried by said cables;
    said test set including a detector responsive to said signals for determining whether said signals are in phase; and
    a plurality of identification markers each of which is engageable with said means for coupling, a first subset of said markers for identifying a phase order of a first subset of said cables, and a second subset of said markers for identifying a matching phase order of a second subset of said cables.

2. The apparatus as in claim 1 wherein said coupling means comprises a plurality of test leads each of which is coupled to one of said cables.

3. The apparatus as in claim 2 wherein said test leads are capacitively coupled to said cables.

4. The apparatus as in claim 2 wherein said test leads are capacitively coupled by semi-conductive clamps to said cables.

5. The apparatus as in claim 2 wherein said test leads are capacitively coupled by semi-conductive tape to said cables.

6. The apparatus as in claim 2 wherein each of said identification markers comprises a collar-like member which is shaped and dimensioned to slidably engage with one of said test leads, whereby said member may be freely drawn by gravity along the length of said engaged test lead.

7. The apparatus as in claim 1 further comprising a protective housing in which said detector is disposed.

8. The apparatus as in claim 1 wherein said detector produces a visual indication of whether said signals are in phase.

9. The apparatus as in claim 1 wherein said detector comprises a pair of test probes coupled to means for measuring current.

10. The apparatus as in claim 9 wherein said means for measuring current comprises a bridge rectifier coupled to a DC microammeter.

11. A method for remotely phase testing primary distribution cables, said method comprising the steps of:
    deenergizing said primary distribution cables;
    coupling each of said cables to a test set such that during testing said test set is remote from high voltage carried by said cables;
    associating an identification marker with selected ones of said cables;
    energizing said cables;
    using said test set to compare signals originating from each of the cables having associated identification markers with signals originating from each of the remaining cables to determine whether a voltage carried by one of said cables having associated identification markers is in phase with a voltage carried by one of said remaining cables; and
    upon determining which voltages are in phase, associating identification markers with the remaining cables to indicate which pairs of all of said primary distribution cables carry voltages that are in phase.

12. The method as in claim 11 wherein said cables are coupled to said test set by a plurality of test leads.

13. The method as in claim 12 wherein one or more of said identification markers comprises a collar-like member which is shaped and dimensioned to slidably engage with one of said test leads, whereby said member may be freely drawn by gravity along the length of said engaged test lead.

14. The method as in claim 11 wherein said test set includes a detector for producing a visual indication of whether said signals are in phase.

15. The method as in claim 14 wherein said detector comprises a pair of test probes coupled to means for measuring current.

16. The method as in claim 15 wherein said means for measuring current comprises a bridge rectifier coupled to a DC microammeter.

17. Apparatus for remotely testing primary distribution cables, said apparatus comprising:
    means for coupling each of a plurality of primary distribution cables to be tested with a test set such that during testing said test set is remote from high voltage carried by said cables;
    said test set including means responsive to signals originating from said primary distribution cables for performing tests including phase matching, open phase detection and energized/not energized verification.

18. The apparatus as in claim 17 wherein said coupling means comprises a plurality of test leads each of which is coupled to one of said cables.

19. The apparatus as in claim 18 wherein said test leads are capacitively coupled to said cables.

20. The apparatus as in claim 18 wherein said test leads are capacitively coupled to said cables by semi-conductive clamps.

21. The apparatus as in claim 18 wherein said test leads are capacitively coupled to said cables by semi-conductive tape.

22. The apparatus as in claim 18 further comprising a plurality of identification markers, each of said markers comprising a collar-like member which is shaped and dimensioned to slidably engage with one of said test leads, whereby said member may be freely drawn by gravity along the length of said engaged test lead.

23. The apparatus as in claim 17 further comprising a protective housing in which said detector is disposed.

24. The apparatus as in claim 17 wherein said detector produces a visual indication of whether said signals are in phase.

25. The apparatus as in claim 17 wherein said detector comprises a pair of test probes coupled to means for measuring current.

26. The apparatus as in claim 25 wherein said means for measuring current comprises a bridge rectifier coupled to a DC microammeter.

* * * * *